United States Patent
Bainton et al.

[11] Patent Number: 6,064,241
[45] Date of Patent: May 16, 2000

[54] DIRECT DIGITAL FREQUENCY SYNTHESIZER USING PULSE GAP SHIFTING TECHNIQUE

[75] Inventors: Steve D. Bainton, Ottawa; Matthew D. Brown, Kanata, both of Canada

[73] Assignee: Nortel Networks Corporation, Montreal, Canada

[21] Appl. No.: 09/082,516

[22] Filed: May 21, 1998

Related U.S. Application Data

[60] Provisional application No. 60/047,945, May 29, 1997.

[51] Int. Cl.[7] .................................................. G06F 1/02
[52] U.S. Cl. ..................... 327/107; 327/106; 327/105; 708/271; 708/276
[58] Field of Search ..................... 327/141, 106, 327/105, 107, 147, 156; 708/271, 276

[56] References Cited

U.S. PATENT DOCUMENTS 5,467,294  11/1995  Hu et al. ................................. 327/106
5,673,212  9/1997  Hansen .................................... 708/271

*Primary Examiner*—Dinh T. Le
*Attorney, Agent, or Firm*—Dallas F. Smith

[57] ABSTRACT

A direct digital frequency synthesizer includes inputs for a reference clock signal and a control word, and an output for a synthesized clock signal. A phase accumulator coupled to the input for the control word and the reference clock signal has an output for a phase control signal. A phase shifter has inputs for the reference clock signal and the phase control signal and an output coupled to the output for the synthesized clock signal. The control word can be used to adjust the output frequency and phase of the synthesized clock signal.

14 Claims, 1 Drawing Sheet

DIRECT DIGITAL FREQUENCY SYNTHESIZER USING PULSE GAP SHIFTING TECHNIQUE

This application claims the benefit of the U.S. Provisional Application No. 60/047,945, filed May 29, 1997.

FIELD OF THE INVENTION

The present invention relates to digital frequency synthesizers and is particularly concerned with directly digitally synthesizing a desired frequency using pulse gap shifting.

BACKGROUND TO THE INVENTION

Systems for transmitting digital signals often use a phase lock loop (PLL) in clocking related functions, such as recovering timing information from a received signal to provide a clock signal for system timing. In a PLL, a frequency synthesizer is used to output a signal having a frequency which is dependent upon an error signal. The error signal represents the difference between the phase of a reference signal which is supplied to the PLL and an output signal.

Frequency synthesizers are known to be susceptible to extraneous conditions, such as temperature variations or input noise. These conditions affect the frequency of their output signals. When a frequency synthesizer is used in a PLL, these conditions manifest themselves as jitter in the phase of the PLL output signal.

The effect of timing error in a digital signal is to reduce the duration in which a zero or one state can be detected in a given time interval. The given time interval is inversely proportional to the transmission rate of the digital signal. As a result, an increase in the transmission rate of the signal decreases the given time interval, subsequently requiring a decrease in the allowable amount of timing error in the signal.

With increasing transmission rates, specifications for maximum allowable timing error in digital signals are becoming increasingly demanding. System clock signals, which are often provided by PLLs, must meet maximum allowable timing error specifications required by the transmission rate of the signals. As these specifications are reduced, the need for clock sources with improved accuracy and controllability arises.

SUMMARY OF THE INVENTION

An object of the present invention is to provide an improved direct digital frequency synthesizer (DDFS).

In accordance with an aspect of the present invention there is provided a direct digital frequency synthesizer for deriving a synthesized clock signal from a reference clock signal having a succession of cyclic pulses comprising: inputs for the reference clock signal and a digital control word; an output for the synthesized clock signal; a phase accumulator coupled to the inputs for the digital control word and the reference clock signal and having an output for a phase shifter control signal, and means for generating an activating event in the phase shifter control signal in dependence upon the digital control word and a first number of pulses of the reference clock signal; and a phase shifter having inputs for the reference clock signal and for the phase shifter control signal, an output for an intermediate frequency signal which is coupled to the synthesized clock signal, means for passing a second number of pulses of the reference clock signal to the intermediate frequency signal and then inhibiting a pulse from passing thereto, and means for passing, responsive to the activating event, a third number of pulses of the reference clock signal to the intermediate frequency signal and then inhibiting a pulse from passing thereto.

An advantage of this aspect of the invention is that it provides the ability to adjust the frequency of the synthesized clock signal according to the value of the digital control word, whereby the number of pulses of the reference clock signal which are passed to the synthesized clock signal are dependent upon the activating event, which is in turn dependent upon the value of the digital control word. Thus, the frequency of the synthesized clock signal is dependent upon the value of the digital control word and the frequency of the reference clock signal.

A further advantage of this aspect of the invention is that it provides a means to adjust the phase of the synthesized clock signal by an amount equal to the period of the reference clock signal divided by the sum of the second number of pulses plus one.

Conveniently, the digital control word is a signed digital control word capable of having a positive or a negative polarity. Furthermore, the phase accumulator comprises: outputs for a forward signal and a back signal; means for generating, in the forward signal, a first activating event in dependence upon the first number of pulses and for one polarity of the digital control word; means for passing, responsive to the first activating event, the third number of pulses of the reference clock signal to the intermediate frequency signal and then inhibiting a pulse from passing thereto; means for generating, in the back signal, a second activating event in dependence upon the first number of pulses and for the other polarity of the digital control word; and means for passing, responsive to the second activating event, a fourth number of pulses in the reference clock signal to the intermediate frequency signal and then inhibiting a pulse from passing thereto.

Conveniently, the third number of pulses is less than the second number of pulses and the fourth number of pulses is greater than the second number of pulses. Advantageously, this provides a means to increase or decrease the frequency of the synthesized clock signal in dependence upon the polarity of the digital control word. Further, the phase of the synthesized clock signal can be likewise advanced or delayed.

In accordance with another aspect of the present invention there is provided a direct digital frequency synthesizer comprising inputs for a reference clock signal and an N-bit signed control word, and an output for a synthesized clock signal; a phase accumulator having inputs coupled to the N-bit signed control word and the reference clock signal, and having outputs for a forward signal and a back signal; a phase shifter having inputs coupled to the reference clock signal and the forward and back signals with an output for an intermediate frequency signal; and a divider having an input coupled to the intermediate frequency signal with an output coupled to the synthesized clock signal.

Conveniently, the phase accumulator comprises an N-bit signed adder having inputs coupled to the N-bit signed control word and another N-bit signed word and outputs for an overflow signal, an underflow signal and an N-bit signed result word, whereby an event on the overflow signal or underflow signals is responsive to the result of adding the N-bit signed control word and the another N-bit signed word; a divider having an input coupled to the reference clock signal and an output for a divided reference clock signal; and a latch having a clock input coupled to the divided reference clock signal, and inputs for the overflow signal, the underflow signal and the N-bit signed result word with their respective latched outputs provided on outputs for the forward signal, the back signal and for the another N-bit signed word.

Conveniently, the phase shifter comprises a counting means for counting a number of pulses of the reference clock signal in dependence upon a controlling means; a pulse inhibiting means for inhibiting the next pulse after the number of pulses has been counted; an output means for outputting all but inhibited pulses of the reference clock signal to the phase shifter output; a controlling means for controlling the number of pulses to be counted in dependence upon the forward and back signals, whereby the number of pulses to be counted after the next inhibited pulse is decreased by one when the forward signal has the event, and after counting the number of pulses the next pulse is inhibited, after which, the number of pulses to be counted is increased by one, and whereby the number of pulses to be counted after the next inhibited pulse is increased by one when the back signal has the event, and after counting the number of pulses the next pulse is inhibited, after which, the number of pulses to be counted is decreased by one. Advantageously, this provides a means to increase or decrease the frequency of the synthesized clock signal in dependence upon the polarity and value of the digital control word. Further, the phase of the synthesized clock signal can be likewise advanced or delayed by an amount equal to the period of the reference clock signal divided by the sum of the number of pulses to be counted plus one.

Another advantage of the DDFS is that it provides linear control of the phase and frequency of the synthesized clock signal irrespective of extraeous conditions, such as temperature, that fall within its normal operating range. Increments of controlled variation in the phase of the synthesized clock signal are a fraction of the period of the reference clock signal XCLK. Further, since the DDFS responds to a digital control word it lends itself more easily to techniques for compensating for other components. For example, a look-up table could be used to compensate for drift in the reference clock signal due to temperature, whereby a compensation factor from the table is added to the control word before the control word is applied to the DDFS. Finally, since the DDFS is digital it allows for larger scale integration of digital PLL circuits, possibly with an entire digital PLL being on one integrated circuit, thus leading to reduced manufacturing costs and greater reliability of the digital PLL.

BRIEF DESCRIPTION OF THE DRAWINGS

The present invention will be further understood from the following detailed description with reference to the drawings in which:

FIG. 2b is a state diagram of the modes of operation of the DDFS of FIG. 2a.

In the drawings, like reference characters in the different figures represent the same features.

DETAILED DESCRIPTION

Figure 1:
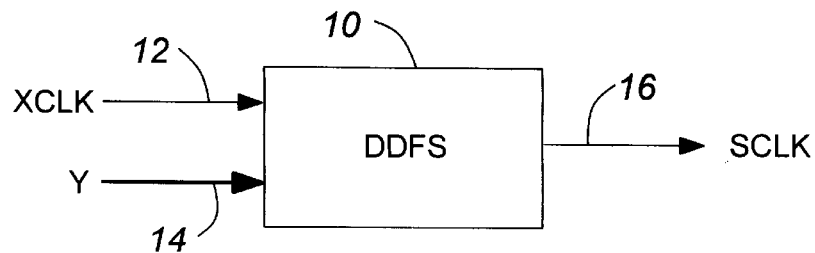
FIG. 1 illustrates in a block diagram a direct digital frequency synthesizer in accordance with an embodiment of the present invention.

Referring to FIG. 1 there is illustrated in a block diagram a direct digital frequency synthesizer in accordance with an embodiment of the present invention. The DDFS 10 includes an input 12 for a reference clock signal XCLK, an input 14 for a control word Y and an output 16 for a synthesized clock signal SCLK.

In operation the DDFS 10 takes the reference clock signal XCLK, which has a frequency $f_x$ of 84.24 MHz, and the control word Y, which is a 21-bit signed integer, as inputs, and outputs the synthesized clock signal SCLK, which has a frequency $f_s$ of 12.96 MHz. The frequency $f_s$ is adjusted by writing the control word Y, of an appropriate value, to the DDFS 10.

Figure 2A:
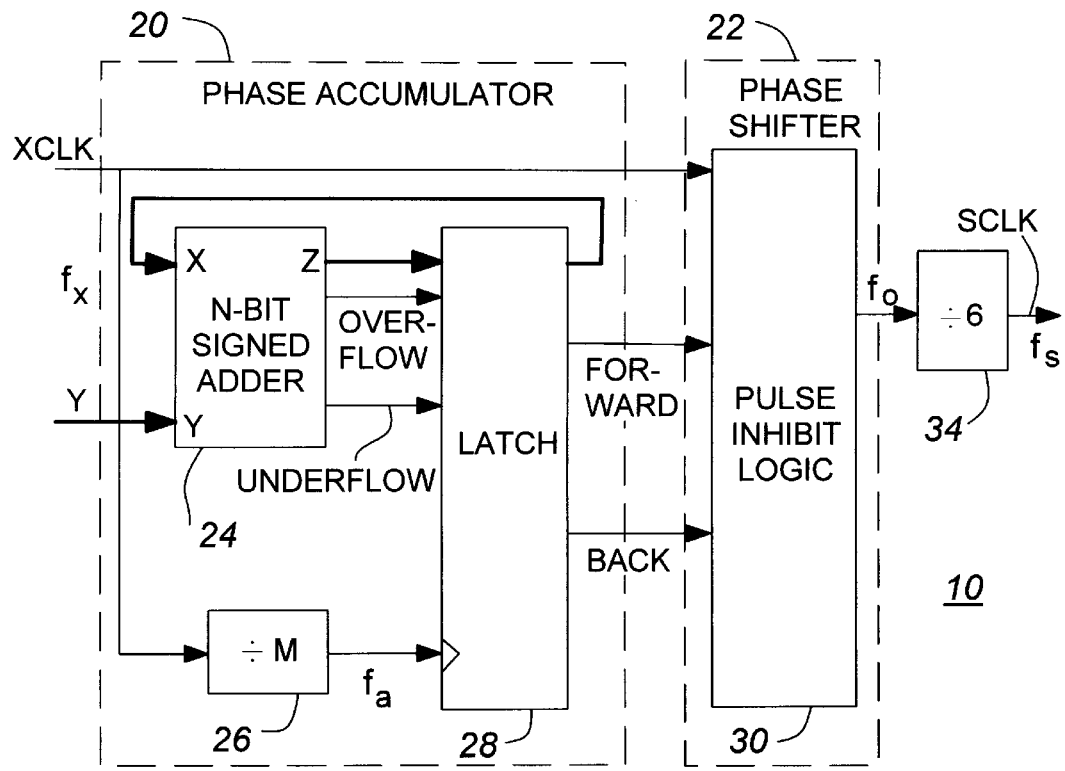
FIG. 2a illustrates in a block diagram the DDFS of FIG. 1 in greater detail.

Referring to FIG. 2a, there is illustrated in a block diagram the direct digital frequency synthesizer of FIG. 1 in greater detail. The direct digital frequency synthesizer 10 includes a phase accumulator 20 and a phase shifter 22. The phase accumulator 20 includes an N-bit signed adder 24, a divide by M divider 26 and a latch 28. The N-bit signed adder 24 has inputs X and Y and an output Z, as well as outputs for overflow and underflow signals. The divide by M divider 26 has an input for the reference clock signal XCLK and an output for a divided clock signal. The divided clock signal is applied to the clock input of the latch 28. The latch 28 provides a latched output of the adder output Z to the input X of the adder 24 and provides a latched output of the overflow and underflow signals to the phase shifter 22 as forward and back signals, respectively. The phase shifter 22 includes a pulse inhibit logic 30 that has inputs for receiving the forward signal, the back signal and the reference clock signal XCLK, as well as an output for an intermediate frequency signal. The intermediate frequency signal, having a frequency $f_o$ of 77.76 MHz, is divided by six by divider 34 to which results in the synthesized clock signal SCLK having a frequency $f_s$ of 12.96 MHz.

With reference to FIG. 2a, in operation the result of the addition of the N-bit signed words provided to the X and Y inputs of the N-bit signed adder 24 is provided at its Z output as a result word Z. When the result of an addition operation is greater than $2^{N-1}$ the overflow signal will transition to its high voltage level causing it to have a rising edge, and the least significant N bits of the result word Z will be provided at the output Z. When an addition operation results in a number less than $-2^{N-1}$, which can occur when the control word Y is negative, the underflow signal will transition to its high level causing it to have a rising edge and the output Z will provide the least significant N bits of the result word Z.

The divided clock signal, which is applied to the clock input of the latch 28, controls latching of the signals applied to the inputs of the latch 28. The divided clock signal has a frequency $f_a$ equal to the frequency $f_x$ of the reference clock signal XCLK divided by M. As a result, the overflow and underflow signals and the result word Z are latched by the latch 28 once every M pulses of the reference clock signal XCLK.

Figure 2B:
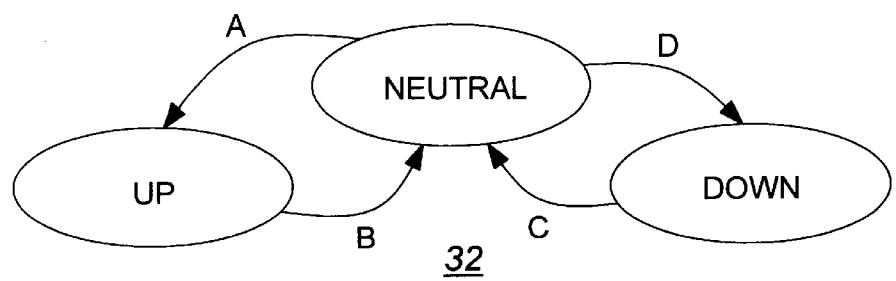

The latched overflow and underflow signals are the forward and back signals provided at outputs of the latch 28. They are applied to inputs of the pulse inhibit logic 30 and are used to control its mode of operation. The pulse inhibit logic 30 has three modes of operation as represented by 32 in FIG. 2b. The modes are neutral, up and down. In these modes of operation an integer variable I represents a number of pulses. The difference between the modes of operation is the number of pulses that are applied to the pulse inhibit logic 30 for every pulse that is inhibited. This number can be I, I−1 or I+1 depending on the mode of operation. The operation of the pulse inhibit logic 30 in each mode, and the effect of the forward and back signals on it, is explained below with reference to FIG. 2b.

Neutral Mode: count to I-1 and inhibit the next pulse. Thus, in the neutral mode, I pulses are applied for each inhibited pulse. If there is a rising edge on the forward signal then go to the up mode after the next inhibited pulse (A). If there is a rising edge on the back signal then go to the down mode after the next inhibit pulse (D).

Up Mode: count to I-2 and inhibit the next pulse, then return to the neutral mode (13). Thus, in the up mode, I-1 pulses are applied for each inhibited pulse.

Down Mode: count to I and inhibit the next pulse, then return to the neutral mode (C). Thus, in the down mode, I+1 pulses are applied for each inhibited pulse.

The variable I is chosen to achieve a desired value of the frequency $f_o$ of the intermediate frequency signal. This value is related to the frequency $f_x$ of the reference clock signal XCLK as follows; in the absence of a rising edge on either the forward or back signals the pulse inhibit logic 30 will remain in the neutral mode, inhibiting a pulse every I pulses. Therefore, in the neutral mode, for every I pulses applied to the pulse inhibit logic 30, by the reference clock signal XCLK, I-1 pulses will be output to the intermediate frequency signal. It follows that the frequency $f_o$ when the pulse inhibit logic 30 is in neutral mode (denoted by $f_{o,n}$) is related to the frequency $f_x$ and the number of pulses I by the following equation:

$$f_{o,n} = f_x\left(\frac{I-1}{I}\right) \quad \text{EQ. 1}$$

In this embodiment I=13 and $f_x$=84.24 MHz and therefore $f_{o,n}$=77.76 MHz. The frequency $f_s$ of the synthesized clock signal SCLK is equal to the frequency $f_o$ divided by six, by the divider 34. The frequency $f_{o,n}$ is 77.76 MHz and therefore the frequency $f_s$ is 12.96 MHz when the pulse inhibit logic 30 is in the neutral mode.

Returning now to the effect of the forward and back signals on the pulse inhibit logic 30, their effect is to shift the timing of the inhibited pulse by advancing or delaying its cyclic timing by one pulse, depending on whether the forward or back signal has a rising edge. The timing of the inhibited pulse occurs one pulse period earlier as a result of a rising edge in the forward signal, and one pulse later as a result of a rising edge in back signal.

Returning to the phase accumulator 20, the result word Z is latched by latch 28 once in every M pulses of the reference clock signal XCLK. A new value of the result word Z is present at the output Z of the adder 24 shortly thereafter. The time delay after which the new value present at the output Z is valid is dependent on the adder 24. This delay should be less than the period of the frequency $f_d$ of the divided clock signal. In this way, the result word Z will be valid at the latch 28 input when the divided clock signal activates the latch 28 to latch its inputs.

The process of adding control word Y to the result word Z, which is applied to the X input, continues normally until the result is greater than the magnitude of the adder, which is $2^{N-1}$. When this condition occurs the voltage level of the overflow signal transitions to high level, after which it is latched by the latch 28 on the next rising edge of the divided clock signal. Thus, the overflow signal voltage level transitions to a high level once in every $2^{N-1}/Y$ pulses of the divided clock signal, which in turn pulses once every M pulses of the reference clock signal XCLK. This relationship is expressed in EQ. 2, below:

$$A = \frac{2^{N-1}M}{|Y|} \quad \text{EQ. 2}$$

where A represents the number of pulses of the reference clock signal XCLK for each rising edge of the overflow, or underflow, signal.

For a negative value of the control word Y, the operation of the adder 24 is the same as described above with one difference. The difference is that the underflow signal transitions to a high voltage level when the result of an addition operation is less than minus $2_{N-1}$. The number of pulses of the reference clock signal XCLK for every rising edge of the underflow signal is also expressed by EQ. 2.

As mentioned earlier, the effect of the forward and back signals is to shift the time at which a pulse is inhibited by one period of the reference clock signal XCLK. However, the pulse inhibit logic 30 is only responsive to the forward and back signals when it is in the neutral mode, as described earlier. In this mode, a rising edge on the forward signal will cause the pulse inhibit logic 30 to go into the up mode after the next inhibited pulse, and return to the neutral mode after a pulse is inhibited from the up mode. Therefore, the pulse inhibit logic 30 can be in the up mode half of the time at most. This limits the range of frequencies that the synthesized clock signal SCLK can be set to for a given value of I. Similarly, the pulse inhibit logic can only be in the down mode half of the time at most.

In the up mode, a pulse is inhibited by the pulse inhibit logic 30 for every I-1 pulses of the reference clock signal XCLK. As a result, there are I-2 pulses in the intermediate frequency signal, for every I-1 pulses of the reference clock signal XCLK.

The frequency $f_o$ is determined by averaging the number of pulses per second in the intermediate frequency signal over a relatively long period of time. The relationship between the frequency $f_o$ and the frequency $f_x$ is determined by the percentage of time that the pulse inhibit logic 30 spends in the up mode in relation to the amount of time it spends in the neutral mode. This percentage is dependent on the control word Y, the divisor M of the divider 26, and the magnitude of the N-bit signed adder 24. The number of pulses of the reference clock signal XCLK that occur for each rising edge of the forward signal is given by the result, A, of EQ. 2. This rising edge causes the pulse inhibit logic 30 to go into up mode once for every A pulses of the reference clock signal XCLK, providing this is not more than half of the time. The remainder of the time the pulse inhibit logic 30 will be in the neutral mode. Accordingly, the number of pulses of the reference clock signal XCLK that will be applied to the pulse inhibit logic 30 for each rising edge of the forward signal equals the number applied in the neutral mode plus the number applied in the up mode. This relationship is expressed by EQ. 3, below:

Pulses applied for each rising edge of the forward signal=bI+(I-1)    EQ. 3 where b denotes the number of times that the pulse inhibit logic 30 cycles through the neutral mode (with I pulses applied each time) and I-1 represents the number of pulses applied during one cycle through the up mode.

It should be evident that the number of pulses of the reference clock signal XCLK for each rising edge of the overflow (or underflow) signal given by EQ. 2 equals the same number of pulses applied in Up and Neutral modes for each rising edge of the forward signal given by EQ. 3. This should be evident because the forward signal is the overflow signal after it has been latched by the latch 28. Likewise with the underflow and back signals.

Equating EQ. 2 and EQ. 3 allows one to solve for b. The result is given in EQ. 4, below. This equation will be useful later in determining a range of useful values of the control word Y given the values of N, M and I.

$$b = \frac{2^{N-1}M}{YI}\frac{(I-1)}{I} \qquad \text{EQ. 4}$$

The frequency $f_o$ of the intermediate frequency signal output by the pulse inhibit logic 30 equals the number of pulses transmitted divided by the number applied times the number of pulses applied per second. This relationship is expressed in EQ. 5, below.

$$f_o = f_x\left[\frac{\text{Pulses Transmitted}}{\text{Pulses Applied}}\right] \qquad \text{EQ. 5}$$

The above equation will be considered in further detail for a positive value of the control word Y, that is, when the pulse inhibit logic 30 operates in the up and neutral modes. According to the previous description of the operating modes of the pulses inhibit logic 30, in the neutral mode I−1 pulses are transmitted for every I pulses that are applied. In the up mode, I−2 pulses are transmitted for every I−1 pulses that are applied. The pulse inhibit logic 30 cycles through the neutral mode b times for every one cycle through the up mode. Given the above information, EQ. 5 can be expressed in terms of b and I as shown below, where $f_{o,(n,u)}$ represents the frequency $f_o$ of the intermediate frequency signal when the pulse inhibit logic 30 operates in the up and neutral modes.

$$f_{o,(n,u)} = f_x\left[\frac{(I-2)+b(I-1)}{(I-1)+b(I)}\right] \qquad \text{EQ. 6}$$

The change in the frequency $f_o$ which results from the rising edges of the forward signal is given by subtracting EQ. 1 from EQ. 6. The result is expressed in EQ. 7, below.

$$\Delta f_{o,(n,u)} = \frac{f_x}{I}\left[\frac{-1}{(I-1)+b(I)}\right] \qquad \text{EQ. 7}$$

Recognizing that the denominator of the term in the brackets is equal to the right hand side of EQ. 3 and recalling that EQ. 3 equals the right hand side of EQ. 2, a substitution can be performed to obtain an equation for the change in the frequency $f_o$ that results from a rising edge of the forward signal. This change in the frequency $f_o$, in terms of the Y, I, N and M, is given by EQ. 8, below.

$$\Delta f_{o,(n,u)} = \frac{-f_x}{I}\left[\frac{Y}{2^{N-1}M}\right] \qquad \text{EQ. 8}$$

The change in phase of the frequency $f_o$ for each rising edge of the forward signal is equal to the change in frequency times the amount of time over which the change occurs. This amount of time is the number of pulses for each rising edge of the forward signal, given by EQ. 3, times the period of the reference clock signal XCLK The result is that the change in phase is inversely proportional to the number of pulses I applied in the neutral mode. This is shown by EQ. 9, below.

$$\Delta\Phi_{o,(n,u)} = -\frac{1}{I} \qquad \text{EQ. 9}$$

Where the change in phase of the frequency $f_o$ given by EQ. 9 is in unit intervals of the frequency $f_o$.

The DDFS 10 synthesizes frequency offsets as a series of phase steps. The phase steps are a fraction of the period of the reference clock signal XCLK, which is the highest rate signal input to the DDFS 10. Using EQ. 8 and EQ. 1, an expression, in terms of Y, I, N and M, for the frequency $f_o$ when the pulse inhibit logic operates in the up and neutral modes can be derived by recognizing that the resultant frequency equals the initial frequency plus the change in frequency. This expression is given by EQ. 10, below.

$$\Delta f_{o,(n,u)} = f_x\left[\frac{I-1}{I} - \frac{Y}{2^{N-1}MI}\right] \qquad \text{EQ. 10}$$

There are three different cases for a positive value of the control word Y that will be considered next. The first case is when the control word Y equals zero. When the control word Y equals zero the result of the adder 24 does not increase or decrease and hence a rising edge never occurs on the overflow or underflow signals. In absence of a rising edge on these signals the pulse inhibit logic 30 will remain in the neutral mode. In this mode the frequency $f_o$ is given by EQ. 1. The second case is when the control word Y has a value such that the variable b, in EQ. 4, is less than or equal to one. Such a condition indicates that the pulse inhibit logic 30 would be in the neutral mode less than half of the time. However, as described earlier, the pulse inhibit logic 30 can not be in the neutral mode less than half of the time. Therefore, the minimum value for b in operation is one. For the case when EQ. 4 results in a value of b<1, the frequency $f_o$ is given by EQ. 6 with b equal to one, the solution of which provides a lower frequency limit of the frequency $f_o$.

Values of the control word Y that result in a solution for EQ. 4 of b<1 will, in operation, set the frequency $f_o$ to the lower limit described above. The values of the control word Y that will cause this condition are supplied by EQ. 11, below.

$$Y \geq \frac{2^{N-1}M}{2I-1} \qquad \text{EQ. 11}$$

The third case, for a positive value of the control word Y, is when b, given by EQ. 4, is greater than one. In this case, substituting b into EQ. 6 provides the frequency $f_o$ of the intermediate frequency signal, alternatively, EQ. 10 can be used. Furthermore, solving EQ. 4 for b>1 produces a requirement on the divisor M. This requirement is expressed by EQ. 12, below. For values of I and N, EQ. 12 specifies the relationship between the divisor M and the control word Y that must be maintained to keep the frequency $f_o$ above its lower limit.

$$M > \frac{(2I-1)Y}{2^{N-1}} \qquad \text{EQ. 12}$$

In order to allow the greatest amount of control over the frequency $f_o$, the largest range of values of the control word Y that have an effect on the frequency $f_o$ should be used. This range of effective values will be such that only one value of the control word Y will cause the frequency $f_o$ to be set to its lower limit. All other values of the control word Y will result in the frequency $f_o$ to be set above its lower limit In terms of the variable b, this range of values should provide the largest range over which the control word Y can be varied while keeping b>1.

The control word Y can take on values from zero to $2^{N-1}$. By substituting the largest value of control word Y into EQ. 12 a relationship between the divisor M of the divider 26 and the variable I is obtained, as expressed in EQ. 13, below. Maintaining this relationship between M and I will provide the largest range of effective values of the control word Y.

$$M \geq 2I-1 \qquad \text{EQ. 13}$$

In this embodiment I=13 and therefore EQ. 13 indicates that the divisor M should be greater than or equal to 25 when the control word Y is a positive number.

Turning now to the case of a negative value of the control word Y, a negative value will cause the pulse inhibit logic 30 to operate in the down and neutral modes. In the down mode, a pulse is inhibited for every I+1 pulses of the reference clock signal XCLK that are applied to the pulse inhibit logic 30. The neutral mode operates as described earlier, with one pulse being inhibited for every I pulses applied As a result, the number of pulses of the reference clock signal XCLK for each rising edge of the back signal equals the number of pulses applied in the neutral mode plus the number applied in the down mode. This relationship is expressed in EQ. 14, below:

$$\text{Pulses applied for each rising edge of the back signal} = cI + (I+1) \qquad \text{EQ. 14}$$

where c denotes the number of times that the pulse inhibit logic 30 cycles through the neutral mode (with I pulses applied each time) and I+1 represents the number of pulses applied during one cycle through the down mode.

Recalling that the number of pulses applied for each rising edge of the underflow signal equals the number applied for each rising edge of the back signal, EQ. 2 can be equated to EQ. 14 to solve for c resulting in EQ. 15, below.

$$c = \frac{2^{N-1}M}{|Y|I} - \frac{(I+1)}{I} \qquad \text{EQ. 15}$$

As stated earlier, the frequency $f_o$ equals the number of pulses per second applied to the pulse inhibit logic 30, multiplied by the number of pulses transmitted by it for the number of pulses applied to it. For a negative value of the control word Y this relationship is expressed by EQ. 16, below.

$$f_o = f_x \left[ \frac{I + c(I-1)}{(I+1) + c(I)} \right] \qquad \text{EQ. 16}$$

In EQ. 16, the terms c(I) and c(I−1) represent the number pulses applied and transmitted in the neutral mode, respectively. The terms (I+1) and (I) represent the number of pulses applied and transmitted in the down mode, respectively.

Using EQ. 16, equations for the change in the frequency $f_o$ for each rising edge of the back signal, and the frequency $f_o$ for a negative value of the control word Y can be derived in terms of Y, I, M and N. These equations are the same as EQ. 8 and EQ. 10, respectively, derived for positive control word Y. Furthermore, an equation for the change in phase of the frequency $f_o$ for each rising edge of the back signal can be derived. The resultant equation is EQ. 9, for a positive value of the control word Y, times minus one to reflect an increase in phase for each rising edge of the back signal.

There are two cases for a negative value of the control word Y that will be considered next. The first is when the control word Y has a value such that the variable c, given by EQ. 15, is less than or equal to one. Such a condition indicates that the pulse inhibit logic 30 would be in the neutral mode less than half of the time However, as described earlier, the pulse inhibit logic 30 can not be in the neutral mode less than half of the time. Therefore, the minimum value for c in operation is one. For the case when EQ. 15 results in a value of c<1, the frequency $f_o$ is given by EQ. 16 with c equal to one, the solution of which provides an upper frequency limit of the frequency $f_o$.

Values of the control word Y that result in a solution for EQ. 15 of c<1 will, in operation, set the frequency $f_o$ to the upper limit described above. The values of the control word Y that will cause this condition are supplied by EQ. 17, below.

$$|Y| \geq \frac{2^{N-1}M}{2I+1} \qquad \text{EQ. 17}$$

The second case, for a negative value of the control word Y, is when EQ. 15 results in a value of c that is greater than one. Solving EQ. 15 for c>1 yields a requirement on the divisor M that specifies the relationship between the divisor M and the control word Y that must be maintained to keep the frequency $f_o$ below its upper limit. This requirement is expressed by EQ. 18, below.

$$M > \frac{(2I+1)|Y|}{2^{N-1}} \qquad \text{EQ. 18}$$

When values of M, N, I and Y result in EQ. 18 being true, substituting c into EQ. 16 provides the frequency $f_o$ of the intermediate frequency signal, alternatively, it can be calculated using EQ. 10.

In order to allow the greatest amount of control over the frequency $f_o$, the largest range of values of the control word Y that have an effect on the frequency $f_o$ should be used. This range of effective values will be such that only one value of the control word Y will cause the frequency $f_o$ to be set to its upper limit. All other values of the control word Y will result in the frequency $f_o$ to be set below its upper limit. In terms of the variable c, this range of values should provide the largest range over which the control word Y can be varied while keeping c>1.

The control word Y can take on values from zero to minus $2^{N-1}$. By substituting the largest negative value of control word Y into EQ. 18 a relationship between the divisor M and the variable I is obtained, as expressed in EQ. 19, below. Maintaining this relationship between the divisor M and the variable I will provide the largest range of effective values of the control word Y.

$$M \geq 2I+1 \qquad \text{EQ.19}$$

In this embodiment I=13, and therefore EQ. 19 indicates that the divisor M should be greater than or equal to 27 when the control word Y is a negative number.

The results for positive and negative control word Y define the value of the divisor M as greater than or equal to 25 for a positive control word Y, and greater than or equal to 27 for a negative control word Y. In order to satisfy both of these requirements the divisor M should be greater than or equal to 27. With a value of the divisor M that meets these conditions the DDFS 10 will operate with values of the control word Y in the range of $+/-2^{N-1}$ without being unduly limited by the upper and lower frequency limits. For I=13 and $f_x$=84.24 MHz, EQ. 16 with c=1 provides an upper frequency limit for the frequency $f_o$ of 78 MHz. Under the same conditions EQ. 6 with b=1 yields a lower frequency limit of 77.5008 MHz. The corresponding upper and lower frequency limits of the synthesized clock signal SCLK are obtained by dividing the latter two limits by six, representing the division performed by the divider 34. This calculation produces upper and lower frequency limits of the synthesized clock signal SCLK of 13 MHz and 12.9168 MHz, respectively. Therefore, the frequency $f_s$ can be varied from 12.9168 MHz to 13 MHz for values of the control word Y from $2^{20}$ to $-2^{20}$, respectively. When the control word Y equals zero, the frequency $f_s$ will be 12.96 MHz.

In addition to controlling the frequency $f_s$ of the synthesized clock signal SCLK, the control word Y can also be used to control its phase. Referring to EQ. 2, and assuming that the values of the control word Y are in its largest effective range, this equation can be used to calculate the number of pulses of the reference clock signal XCLK, for each shift in phase of the intermediate frequency signal. For example, if the control word Y initially equals zero, then by setting it to a new value of $2^{16}$, the phase of the synthesized clock signal SCLK will be delayed after a certain number of pulses. The amount of delay will be equal to one period of the intermediate frequency signal divided by I. The delay will occur after 432 periods of the reference clock signal XCLK from the time that the control word Y was set to its new value. The value of 432 periods is calculated from EQ. 2 using M=27, N=21 and Y=$2^{16}$. If the frequency $f_o$ of the intermediate frequency signal equals 77.76 MHz and I=13, the amount of phase delay in terms of time is 989 picoseconds. This delay occurs after 5.13 (=432/$f_x$) microseconds have elapsed. After the phase delay has occurred the control word Y can be reset to zero to return the frequency $f_s$ to 12.96 MHz. This resetting would have to be done within 5.13 microseconds after the phase delay, in order to avoid another phase delay from occurring.

The capability to control the phase of the synthesized clock signal SCLK could be used in a phase locked loop circuit (PLL). In a PLL circuit, there is a need to control the phase of the output signal relative to the phase of an input signal. This is accomplished by providing feedback of the output signal to a phase comparator. The phase comparator output is a phase difference signal, which is used for controlling the phase of the output signal. To use the DDFS 10 in this application, the phase difference signal would need to correspond to an appropriate value of the control word Y. This value could be used to shift the phase of the synthesized clock signal SCLK, by the required amount, according to the method described in the previous example.

Various other modifications of the invention may be made without departing from the principle thereof For example, the pulse inhibit logic 30 could be implemented with only two modes of operation. These could be up and neutral, or neutral and down. In either case the pulse inhibit logic 30 would only be responsive to a rising edge on one of the forward or back signals. The other signal would be non-functional, and therefore not required. Furthermore, the DDFS 10 would only be responsive to either positive or negative values of the control word Y, depending on the modes of operation that were used. However, a value of the control word Y in the middle of the effective range of values could be selected as a base value, and the control word Y set to values lower or greater than it, in order to set the frequency $f_s$ to a desired value. With these modifications, the frequency $f_o$ could still be calculated from EQ. 1, EQ. 6 and EQ. 16, depending on the modes of operation that were implemented. This modification could simplify the pulse inhibit logic 30, however, at the expense of control over the frequency fo.

Another modification to the pulse inhibit logic 30 would be to enable the mode of operation to remain in the up or down mode if another rising edge occurred on the forward or back signals, respectively. The result would be different from the disclosed embodiment, wherein the forward and back modes are always followed by the neutral mode. The effect of this modification would be to change the upper and lower frequency limits of the frequency $f_o$. This is because the pulse inhibit logic 30 could be in the neutral mode less than half of the time. Therefore, the modification would remove the limitation that b and c must be greater than or equal to one in operation. The new upper and lower frequency limits could be calculated from EQ. 16 and EQ. 6, respectively, with c and b equal to zero. This modification would increase the range between the upper and lower frequency limits at the expense of reduced sensitivity to the frequency $f_o$ to the control word Y.

A modification to the phase accumulator 20 would be to remove the divider 26. The effect of this modification on the effective range of values of the control word Y can be determined by setting M equal to one in EQ. 11 and EQ. 17. In addition, the adder 24 would have to be fast enough to be able to provide valid values of the result word Z and the overflow and underflow signals before the latch 28 latches its inputs. This modification reduces the number of components in the DDFS 10 but requires a modification of the pulse inhibit logic 30 and requires that the adder 24 be capable of running at a faster speed of operation than in the described embodiment.

Another modification to the DDFS 10 would be to remove the divider 34. In this case, the frequency $f_s$ of the synthesized clock signal SCLK would equal the frequency $f_o$ of the intermediate frequency signal. This modification would reduce the number of components in the DDFS 10 but would increase the amount jitter of the synthesized clock signal SCLK.

Yet another modification would be to replace the N-bit adder 24 with an loadable N-bit up-down counter. In this case, the counter would be loaded with the absolute value of the control word Y. The counter would either count up or down, depending on the whether the control word was negative or positive. The underflow and overflow signals could be generated when the counter counts past zero or $2^N$, respectively. After either of these conditions occurred, the counter could be reloaded with the control word Y to repeat the same counting process. This modification would change the relationship between the number of pulses of the reference clock signal XCLK and the occurrence of a rising edge on the forward and back signals. The values of control word Y would not necessarily correspond to the same value of the frequency $f_o$ as with the disclosed embodiment, however, this difference would not have a substantial effect on the operation of the DDFS 10.

Still yet another modification would be to change the sequence of the pulse inhibit operation from a regular sequence of one pulse inhibited in I pulses transmitted, to another sequence. For example, the sequence could be pseudo random, in that the number of pulses passed to the intermediate frequency signal output from the reference clock signal input, before a pulse was inhibited in the neutral mode, could be a pseudo random number instead of a constant number. The pseudo random numbers would repeat in a sequence over a long period of time and hence the frequency of the intermediate frequency signal would be constant on average taken over a relatively long interval. By shifting the sequence of inhibited pulses in the same manner as previously described, that is, by advancing or delaying the timing of the next inhibited pulse, yet still maintaining the sequence after the shift, the phase and thus the frequency of the intermediate frequency signal could be controlled.

Finally, the values of N, I, M and the divisor of divider 34 could be varied from those in the disclosed embodiment. Depending on the values used, changes in the sensitivity of control over the frequency $f_s$, and the upper and lower frequency limits could be affected.

A direct digital frequency synthesizer has been disclosed according to an embodiment of the present invention. Numerous modifications, variations, and adaptations may be made to the particular embodiment of the invention described above without departing from the scope of the invention that is defined in the claims.

What is claimed is:

1. A direct digital frequency synthesizer for deriving a synthesized clock signal from a reference clock signal having a succession of cyclic pulses comprising:

inputs for the reference clock signal and a digital control word;

an output for the synthesized clock signal;

a phase accumulator coupled to the inputs for the digital control word and the reference clock signal and having an output for a phase shifter control signal, and means for generating an activating event in the phase shifter control signal in dependence upon a value of the digital control word and a first number of pulses of the reference clock signal; and a phase shifter having inputs for the reference clock signal and for the phase shifter control signal, an output for an intermediate frequency signal which is coupled to the synthesized clock signal, means for passing a second number of pulses of the reference clock signal to the intermediate frequency signal and then inhibiting the next pulse in the succession of pulses from passing thereto, whereby the means for passing, in response to the activating event passes a third number of pulses of the reference clock signal to the intermediate frequency signal.

2. A direct digital frequency synthesizer as claimed in claim 1, wherein the digital control word is a signed digital control word capable of having a positive or a negative value.

3. A direct digital frequency synthesizer as claimed in claim 2, wherein the phase shifter control signal further comprises:

a forward signal and a back signal, and wherein the means for generating causes a first activating event in the forward signal in dependence upon the first number of pulses and a positive value of the digital control word, and wherein the means for passing, is responsive to the first activating event whereby the third number of pulses of the reference clock signal are passed to the intermediate frequency signal.

4. A direct digital frequency synthesizer as claimed in claim 3, wherein the means for generating causes a second activating in the back signal in dependence upon the first number of pulses and a negative value of the digital control word, and wherein the means for passing is responsive to the second activating event whereby a fourth number of pulses of the reference clock signal are passed to the intermediate frequency signal.

5. A direct digital frequency synthesizer as claimed in claim 4, wherein the third number of pulses is less than the second number of pulses and the fourth number of pulses is greater than the second number of pulses.

6. A direct digital frequency synthesizer as claimed in claim 1, further comprising a divider having an input coupled to the intermediate frequency signal and an output coupled to the output for the synthesized clock signal.

7. A direct digital frequency synthesizer as claimed in claim 1, further comprising a divider having an input coupled to the reference clock signal and an output for a divided reference clock signal coupled to the input of the phase accumulator for the reference clock signal, whereby the activating event in the phase shifter control signal is dependent upon the digital control word and a number of pulses of the divided reference clock signal.

8. A direct digital frequency synthesizer comprising:

inputs for a reference clock signal and an N-bit signed control word;

an output for a synthesized clock signal;

a phase accumulator having inputs coupled to the N-bit signed control word and the reference clock signal and having outputs for forward and back signals;

a phase shifter having inputs coupled to the reference clock signal, the forward signal and the back signal, and having an output for an intermediate frequency signal; and a divider having an input coupled to the intermediate frequency signal and having an output coupled to the synthesized clock signal.

9. A direct digital frequency synthesizer as claimed in claim 8 wherein the phase accumulator further comprises:

an N-bit signed adder having inputs coupled to the N-bit signed control word and another N-bit signed word, and having outputs for an overflow signal, an underflow signal and an N-bit signed result word, whereby an event in the overflow signal or underflow signal is responsive to the result of adding the N-bit signed control word and the another N-bit signed word;

a divider having an input coupled to the reference clock signal and an output for a divided reference clock signal; and a latch having a clock input coupled to the divided reference clock signal, and inputs for the overflow signal, the underflow signal, and the N-bit signed result word with their respective latched outputs provided on outputs for the forward signal, the back signal and for the another N-bit signed word.

10. A direct digital frequency synthesizer as claimed in claim 9 wherein the reference clock signal is cyclic comprising a succession of pulses.

11. A direct digital frequency synthesizer as claimed in claim 10 wherein the phase shifter comprises:

a counting means for counting pulses of the reference clock signal, whereby a number of pulses to be counted is dependent on a controlling means;

a coupling means for coupling the number pulses of the reference clock signal to the phase shifter output and then inhibiting the next pulse in the succession of pulses; and a controlling means for determining the number of the pulses, whereby the number of pulses is decreased by one in response to the event occurring in the overflow signal until the next pulse is inhibited, after which the number of pulses is increased by one, and whereby the number of pulses is increased by one in response to the event occurring in the underflow signal until the next pulse is inhibited, after which the number of pulses is decreased by one.

12. A direct digital frequency synthesizer as claimed in claim 11 wherein the controlling means comprises a pulse inhibit logic having a neutral, an up and a down mode of operation wherein, in the neutral mode a number of pulses is counted before the next pulse is inhibited and a rising edge on the forward signal causes the pulse inhibit logic to enter the up mode after the next pulse is inhibited, and a rising edge on the back signal causes the pulse inhibit logic to enter the down mode after the next pulse is inhibited.

13. A direct digital frequency synthesizer as claimed in claim 12 wherein, in the up mode of operation the number of pulses less one is counted before the next pulse is inhibited, after which the pulse inhibit logic returns to the neutral mode.

14. A direct digital frequency synthesizer as claimed in claim 13 wherein, in the down mode the number of pulses plus one is counted before the next pulse is inhibited, after which the pulse inhibit logic returns to the neutral mode.

* * * * *